United States Patent
Yang et al.

(10) Patent No.: US 9,777,376 B2
(45) Date of Patent: Oct. 3, 2017

(54) FILM-FORMING APPARATUS

(71) Applicant: ULVAC, Inc., Chigasaki-shi (JP)

(72) Inventors: Yixin Yang, Chigasaki (JP); Yoshiyuki Mitsuhashi, Fujisawa (JP); Masayuki Iijima, Chigasaki (JP); Sadatsugu Wakamatsu, Chigasaki (JP); Kazuhiko Saito, Chigasaki (JP); Tomoharu Fujii, Chigasaki (JP); Tsuyoshi Yoshimoto, Chigasaki (JP); Togo Hosoya, Chigasaki (JP); Takayoshi Hirono, Chigasaki (JP); Nobuhiro Hayashi, Chigasaki (JP); Nobuaki Kakutani, Chigasaki (JP); Naoki Sunagawa, Chigasaki (JP); Isao Tada, Chigasaki (JP); Hiroyuki Hirano, Chigasaki (JP)

(73) Assignee: ULVAC, INC., Chigasaki-shi (JP)

( * ) Notice: Subject to any disclaimer, the term of this patent is extended or adjusted under 35 U.S.C. 154(b) by 729 days.

(21) Appl. No.: 14/323,583

(22) Filed: Jul. 3, 2014

(65) Prior Publication Data

US 2014/0311410 A1    Oct. 23, 2014

Related U.S. Application Data

(63) Continuation of application No. PCT/JP2013/050573, filed on Jan. 15, 2013.

(30) Foreign Application Priority Data

Jan. 16, 2012  (JP) .................................. 2012-006578

(51) Int. Cl.
*C23C 16/52* (2006.01)
*C23C 16/44* (2006.01)
(Continued)

(52) U.S. Cl.
CPC ................. *C23C 16/52* (2013.01); *B05D 1/62* (2013.01); *C23C 14/12* (2013.01); *C23C 14/562* (2013.01); *C23C 16/4405* (2013.01); *B05D 1/34* (2013.01)

(58) Field of Classification Search
CPC ....... C23C 16/52; C23C 14/12; C23C 14/562; C23C 16/4405; B05D 1/62; B05D 1/34
(Continued)

(56) References Cited

U.S. PATENT DOCUMENTS 3,829,373 A * 8/1974 Kuehnle ................. C23C 14/34
                                                      204/192.12
4,151,034 A * 4/1979 Yamamoto ............. B23K 28/00
                                                      156/345.31

(Continued)

FOREIGN PATENT DOCUMENTS

JP    2005-97664 A1    4/2005
JP    2008-57020 A1    3/2008

(Continued)

OTHER PUBLICATIONS

Japanese Notice of Reasons for Refusal for corresponding patent application No. 2013-554292, with partial English translation.
(Continued)

*Primary Examiner* — Rudy Zervigon
(74) *Attorney, Agent, or Firm* — Kratz, Quintos & Hanson, LLP

(57) ABSTRACT

Provided is a film-forming apparatus capable of cleaning a discharge apparatus under a state in which a film-forming space and a cleaning gas ambience are separated from each other while continuing to form a film on an object to be film-formed having a film-like shape. The film-forming apparatus includes a cleaning chamber configured to be connected to a film-forming space when a shutter is opened,
(Continued)

and to be separated from the film-forming space and cause a cleaning gas to be discharged into an internal space when the shutter is closed; means for moving a discharge apparatus between a cleaning position inside the cleaning chamber and a film-forming position closer to a cylindrical member than the cleaning position; and a control apparatus that controls the discharge apparatus to discharge the raw material gas when the discharge apparatus is moved to the film-forming position, and controls the shutter to be closed so as to fill the cleaning chamber with the cleaning gas when the discharge apparatus is moved to the cleaning position.

6 Claims, 5 Drawing Sheets

(51) Int. Cl.
 *B05D 1/00* (2006.01)
 *C23C 14/12* (2006.01)
 *C23C 14/56* (2006.01)
 *B05D 1/34* (2006.01)

(58) Field of Classification Search
 USPC .............. 156/345.3, 345.31, 345.33, 345.34; 118/718
 See application file for complete search history.

(56) References Cited

U.S. PATENT DOCUMENTS

| | | | | |
|---|---|---|---|---|
| 4,252,595 | A * | 2/1981 | Yamamoto | B23K 28/00 156/345.31 |
| 4,294,678 | A * | 10/1981 | Kuehnle | C23C 14/562 204/192.12 |
| 4,423,956 | A * | 1/1984 | Gordon | G03B 27/08 118/718 |
| 4,462,333 | A * | 7/1984 | Nath | C23C 16/455 118/718 |
| 5,773,088 | A * | 6/1998 | Bhat | C23C 16/545 118/500 |
| 6,082,292 | A * | 7/2000 | Denes | B29C 59/14 118/718 |
| 6,202,591 | B1 * | 3/2001 | Witzman | C23C 14/243 118/723 VE |
| 6,367,414 | B2 * | 4/2002 | Witzman | C23C 14/243 118/718 |
| 7,169,232 | B2 * | 1/2007 | Strip | C23C 14/042 118/718 |
| 7,789,961 | B2 * | 9/2010 | Nelson | C23C 16/45517 118/715 |
| 8,092,600 | B2 * | 1/2012 | Fujinawa | C23C 16/45578 118/718 |
| 8,211,231 | B2 * | 7/2012 | Kerr | C23C 16/45551 118/50 |
| 8,398,770 | B2 * | 3/2013 | Levy | C23C 16/45519 118/715 |
| 8,420,168 | B2 * | 4/2013 | Kerr | C23C 16/45551 118/50 |
| 8,900,366 | B2 * | 12/2014 | Rosenblum | B05D 1/60 118/719 |
| 2001/0005553 | A1 * | 6/2001 | Witzman | C23C 14/243 428/402 |
| 2005/0239294 | A1 * | 10/2005 | Rosenblum | B05D 1/60 438/778 |
| 2008/0102222 | A1 * | 5/2008 | Fujinawa | C23C 16/45578 427/569 |
| 2008/0121176 | A1 * | 5/2008 | Duclos | H01J 37/32394 118/712 |
| 2009/0110809 | A1 * | 4/2009 | Buschbeck | B65H 23/24 427/74 |
| 2011/0033638 | A1 * | 2/2011 | Ponnekanti | C23C 16/45519 427/569 |
| 2011/0064890 | A1 * | 3/2011 | Fujinami | C23C 16/44 427/569 |
| 2011/0097492 | A1 * | 4/2011 | Kerr | C23C 16/4401 427/248.1 |
| 2011/0209830 | A1 * | 9/2011 | Hirono | C23C 16/505 156/345.37 |
| 2014/0158531 | A1 * | 6/2014 | Choi | C23C 14/352 204/298.12 |
| 2014/0208565 | A1 * | 7/2014 | Lotz | C23C 14/562 29/428 |
| 2014/0212599 | A1 * | 7/2014 | Buschbeck | C23C 14/562 427/569 |
| 2014/0212600 | A1 * | 7/2014 | Neil | H01J 37/32449 427/569 |
| 2014/0290861 | A1 * | 10/2014 | Dieguez-Campo | C23C 14/562 156/345.31 |
| 2015/0218692 | A1 * | 8/2015 | Nakada | F27B 9/28 427/177 |
| 2016/0177451 | A1 * | 6/2016 | Shiono | C03C 17/42 427/535 |
| 2017/0058404 | A1 * | 3/2017 | Dieguez-Campo | C23C 14/562 |

FOREIGN PATENT DOCUMENTS

| | | |
|---|---|---|
| JP | 2008-115412 A1 | 5/2008 |
| JP | 2008174826 A | 7/2008 |
| JP | 2009-24224 A1 | 2/2009 |
| JP | 2009-138239 A1 | 6/2009 |

OTHER PUBLICATIONS

Chinese Office Action for corresponding Chinese patent application No. 201380005648.1, with partial English translation.
International Search Report for International Application No. PCT/JP2013/050573 dated Apr. 23, 2013.

* cited by examiner

FILM-FORMING APPARATUS

This application is a continuation of International Application No. PCT/JP2013/050573, filed on Jan. 15, 2013, which claims priority to Japan Patent Application No. 2012-006578, filed on Jan. 16, 2012. The contents of the prior applications are herein incorporated by references in their entireties.

BACKGROUND

The present invention generally relates to a film-forming apparatus, and more particularly, to a technology of continuously forming a film on an object to be film-formed having a film-like shape.

Nowadays, there is a demand for a technology of continuously forming a film on an object to be film-formed having a film-like shape, for the purpose of attaining a light-weight, flexible, and large-area substrate.

FIG. 6 is a structural view illustrating an inside of a conventional art film-forming apparatus 100.

The conventional art film-forming apparatus 100 includes a film-forming chamber 111 having a film-forming space 116 defined therein, a cylindrical member 112 arranged in the film-forming space 116, and a discharge apparatus 113 arranged outside the cylindrical member 112 and configured to discharge a raw material gas.

An object to be film-formed having a film-like shape is brought into close contact with the cylindrical member 112; and a back surface of the object to be film-formed is brought into close contact with the cylindrical member 112. When the object to be film-formed is moved while rotating the cylindrical member 112, a thin film is formed on a front surface of the object to be film-formed.

During the film formation, a part of the raw material gas in the film-forming space 116 adheres to the discharge apparatus 113, and an adhesion film is formed on the discharge apparatus 113. When the discharge apparatus 113 having the adhesion film adhering thereto is left as it is, the adhesion film peels off and becomes a dust source to affect the subsequent film formation to be carried out in the same film-forming chamber 111. Therefore, it is necessary to clean the discharge apparatus 113 before the adhesion film peels off.

In the conventional art film-forming apparatus 100, however, it is necessary to stop the film formation when cleaning the discharge apparatus 113 after the start of the film formation. Thus, the productivity is poor.

JPA2008-57020 and JPA2009-138239 disclose a technology for carrying out the film formation and the cleaning at the same time. However, when the film formation and the cleaning are carried out at the same time, there is a problem in that the film-forming gas and the cleaning gas are mixed with each other to affect both the film formation and the cleaning.

SUMMARY OF INVENTION

In order to solve the above-mentioned problem, according to one embodiment of the present invention, there is provided a film-forming apparatus including a film-forming chamber having a film-forming space defined therein, a cylindrical member arranged in the film-forming space and rotatable about one center axis, and a plurality of discharge apparatuses arranged outside the cylindrical member along a circumferential direction of the cylindrical member, each of the plurality of discharge apparatus being configured to discharge a raw material gas, and an object to be film-formed having a film-like shape being in close contact with the cylindrical member so as to close contact a back surface of the object to be film-formed with the cylindrical member. The object to be film-formed is moved while rotating the cylindrical member; and a thin film is formed on a front surface of the object to be film-formed. The film-forming apparatus further includes a cleaning chamber including a shutter; the cleaning chamber being configured to: when the shutter is opened, connecting an internal space of the cleaning chamber to the film-forming space, and when the shutter is closed, separating the internal space from the film-forming space, and discharging a cleaning gas into the internal space; means for moving each of the plurality of discharge apparatuses between a cleaning position inside the cleaning chamber and a film-forming position closer to the cylindrical member than the cleaning position; and a control apparatus for controlling a start and stop of the discharge of the raw material gas and the discharge of the cleaning gas, and for controlling the movement of each of the plurality of discharge apparatuses. The control apparatus is configured such that when each of the plurality of discharge apparatuses is moved to the film-forming position, each of the plurality of discharge apparatuses is controlled to discharge the raw material gas, and when each of the plurality of discharge apparatuses is moved to the cleaning position, the shutter is controlled to be closed so as to fill the cleaning chamber with the cleaning gas.

The present invention is the film-forming apparatus wherein the cleaning gas is discharged from each of the plurality of discharge apparatuses that is positioned inside the cleaning chamber.

The present invention is the film-forming apparatus, wherein the cleaning gas is discharged through a cleaning gas discharge hole that is formed in a wall surface of the cleaning chamber.

The present invention is the film-forming apparatus wherein under a state in which one of the plurality of discharge apparatuses on an upstream side with respect to a movement direction of the object to be film-formed is arranged at the film-forming position and another of the plurality of discharge apparatuses on a downstream side with respect to the movement direction of the object to be film-formed is arranged at the cleaning position, the control apparatus is configured to control one of the plurality of discharge apparatuses on the upstream side to move to the cleaning position when a switching position provided to the object to be film-formed passes by a position facing one of the plurality of discharge apparatuses on the upstream side, and to control another one of the plurality of discharge apparatuses on the downstream side to move to the film-forming position when the switching position passes by a position facing another one of the plurality of discharge apparatuses on the downstream side.

The present invention is the film-forming apparatus, wherein under a state in which one of the plurality of discharge apparatuses on the upstream side with respect to the movement direction of the object to be film-formed is arranged at the cleaning position and another one of the plurality of discharge apparatuses on the downstream side with respect to the movement direction of the object to be film-formed is arranged at the film-forming position, the control apparatus is configured to control one of the plurality of discharge apparatuses on the upstream side to move to the film-forming position when the switching position provided to the object to be film-formed passes by the position facing one of the plurality of discharge apparatuses on the upstream side, and to control another one of the plurality of discharge apparatuses on the downstream side to move to the cleaning position when the switching position passes by the position facing another one of the plurality of discharge apparatuses on the downstream side.

The present invention is the film-forming apparatus, each of the plurality of discharge apparatuses further includes a movable adhesion preventive plate; and when each of the plurality of discharge apparatuses is positioned at the cleaning position, the movable adhesion preventive plate is positioned inside the cleaning chamber that is separated from the film-forming space.

Further, according to one embodiment of the present invention, there is provided a film-forming apparatus, including a cylindrical member and a plurality of discharge apparatus arranged inside a film-forming chamber. The film-forming apparatus is configured to: rotate the cylindrical member under a state such that a back surface of an object to be film-formed having a film-like shape is brought into contact with a side surface of the cylindrical member; and while causing the object to be film-formed to travel, a raw material gas is discharged from at least one of the plurality of discharge apparatuses toward a part of the object to be film-formed, which is brought into contact with the cylindrical member; and form a thin film on a front surface of the object to be film-formed. The film-forming chamber includes a plurality of cleaning chambers provided therein. Each of the plurality of cleaning chambers has set therein a cleaning position where each of the plurality of discharge apparatuses can be positioned. A plurality of film-forming positions are set at such positions that a distance between each of the plurality of film-forming positions and the side surface of the cylindrical member is shorter than a distance between the cleaning position and the side surface of the cylindrical member. The plurality of film-forming positions are arranged in a line along a circumferential direction of the side surface. Each of the plurality of cleaning chambers is configured such that a cleaning gas can be introduced thereto. The film-forming apparatus further includes means for moving each of the plurality of discharge apparatuses between each of the plurality of film-forming positions and the cleaning position; and a control apparatus for controlling a start and stop of the discharge of the raw material gas and discharge of the cleaning gas from each of the plurality of discharge apparatuses, and for controlling the movement of each of the plurality of discharge apparatuses between each of the plurality of film-forming positions and the cleaning position. An internal space of each of the plurality of cleaning chambers and an external space of each of the plurality of cleaning chambers can be isolated from each other.

The film-forming apparatus according to one embodiment of the present invention may include a shutter for isolating the internal space of each of the plurality of cleaning chambers and the external space of each of the plurality of cleaning chambers from each other. Further, the control apparatus may control the cleaning gas to be discharged from each of the plurality of discharge apparatuses that is positioned inside each of the plurality of cleaning chambers Alternatively, each of the plurality of cleaning chambers may have a discharge hole for the cleaning gas.

Further, according to one embodiment of the present invention, the plurality of discharge apparatuses are arranged in line along the circumferential direction of the side surface of the cylindrical member, and the plurality of discharge apparatus can be positioned at the plurality of film-forming positions facing the side surface of the cylindrical member. In order to move a first discharge apparatus that is discharging the raw material gas to a corresponding one of the plurality of cleaning chambers, a second discharge apparatus that does not discharge the raw material gas may be caused to start discharging the raw material gas instead of the first discharge apparatus.

In order to switch the first discharge apparatus and the second discharge apparatus, in a case where the second discharge apparatus is positioned on an upstream side of the first discharge apparatus with respect to a movement direction of the object to be film-formed, when a switching position provided to the object to be film-formed passes by a position facing the second discharge apparatus, the second discharge apparatus is caused to start discharging the raw material gas, and when the switching position passes by a position facing the first discharge apparatus, the discharge of the raw material gas from the first discharge apparatus is stopped.

In a case where the second discharge apparatus is positioned on a downstream side of the first discharge apparatus, when the switching position passes by a position facing the first discharge apparatus, the discharge of the raw material gas from the first discharge apparatus may be stopped, and when the switching position passes by a position facing the second discharge apparatus, the second discharge apparatus may be caused to start discharging the raw material gas.

The first discharge apparatus that has stopped the discharge of the raw material gas may be moved to the corresponding one of the plurality of cleaning chambers for cleaning.

The film-forming space and the internal space of the cleaning chamber are isolated from each other by the shutter so that the cleaning gas does not flow into the film-forming space to damage the object to be film-formed.

Further, the raw material gas does not flow into the cleaning chamber to contaminate the inside of the cleaning chamber.

When each of the discharge apparatus is individually cleaned by moving into the cleaning chamber, dust is not generated from the discharge apparatus, and thus, the thin film can continuously be formed on the object to be film-formed. For example, the discharge apparatus can be moved into the cleaning chamber one by one.

A part of the discharge apparatus which discharges the raw material gas can be brought closer to the cylindrical member; and hence, the film formation can be carried out under a state in which an interval between the discharge apparatus and the cylindrical member is set to a predetermined value.

DETAILED DESCRIPTION OF THE INVENTION

The structure of a film-forming apparatus according to the present invention is described.

Figure 1:
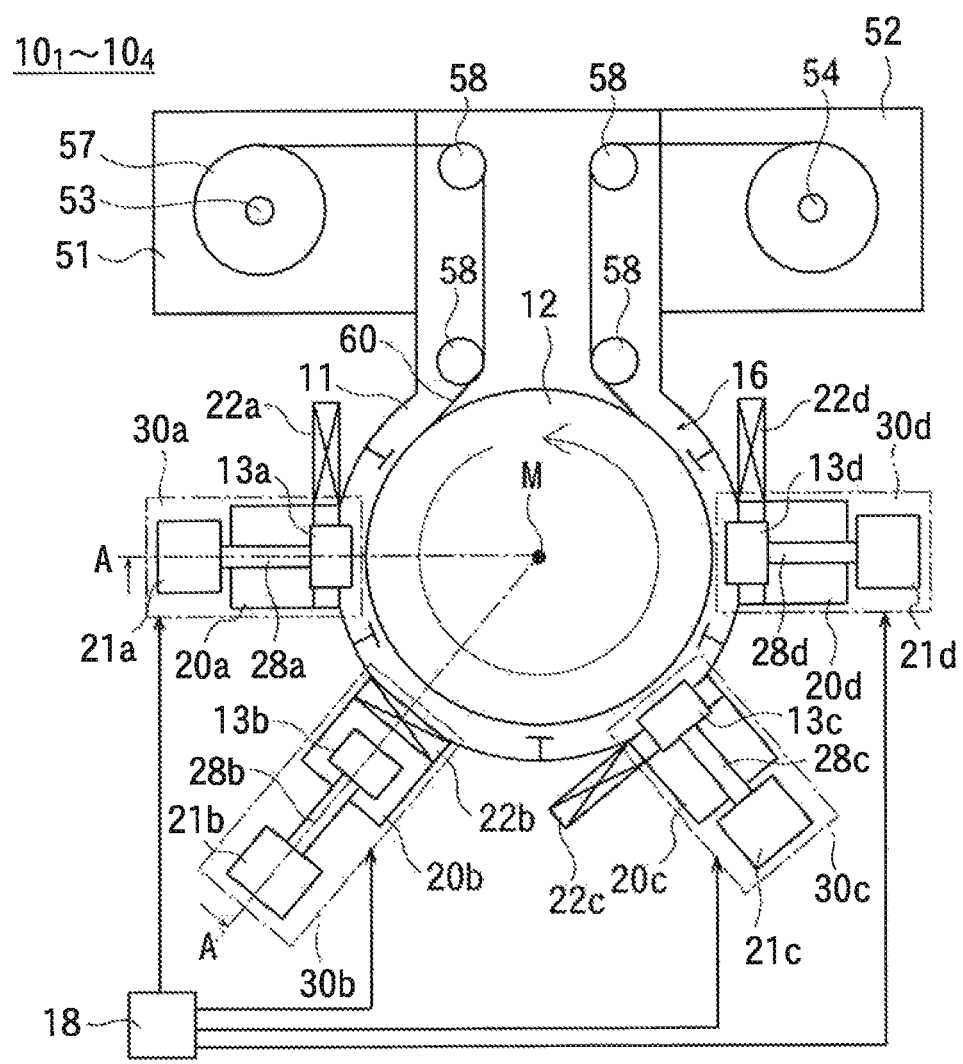
FIG. 1 is a structural view illustrating an inside of a film-forming apparatus according to the present invention.

FIG. 1 is a structural view illustrating an inside of each of film-forming apparatuses $10_1$ to $10_4$ according to first to fourth embodiments of the present invention. It is noted that, in the film-forming apparatus $10_2$ according to the second embodiment, the positions of cleaning chambers 20a to 20d (to be described later) are different from the positions illustrated in FIG. 1.

Each of the film-forming apparatuses $10_1$ to $10_4$ according to the first to fourth embodiments includes a film-forming chamber 11 having a film-forming space 16 defined therein, a cylindrical member 12 having a cylindrical shape, which is arranged in the film-forming space 16 and rotatable about one center axis M, and a plurality of discharge units 30a to 30d arranged outside the cylindrical member 12 along a circumferential direction of the cylindrical member 12.

The discharge units 30a to 30d have the same structure. The center axis M refers to a straight line passing through the center of two circles that define two respective bases of the cylindrical member 12.

Structure of Film-Forming Apparatus According to First Embodiment

Figure 2:
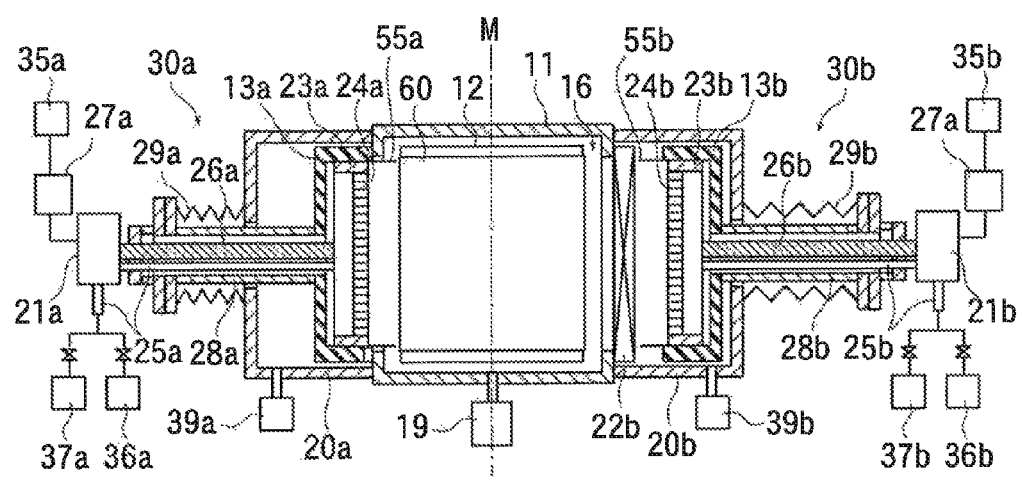
FIG. 2 is a sectional view cut along the line A-A shown in FIG. 1 of the film-forming apparatus according to a first embodiment of the present invention.

FIG. 2 is a sectional view cut along the line A-A shown in FIG. 1 of the film-forming apparatus $10_1$ of FIG. 1 according to the first embodiment of the present invention.

The structures of the discharge units 30a to 30d of the film-forming apparatus $10_1$ according to the first embodiment are described by taking the discharge unit 30a as a representative example.

The discharge unit 30a includes a discharge apparatus 13a configured to discharge a raw material gas.

The discharge apparatus 13a is herein an elongate hollow container having a longitudinal direction. The longitudinal direction of the discharge apparatus 13a is oriented parallel to the center axis M of the cylindrical member 12.

A shower plate 24a is provided on a surface of the discharge apparatus 13a; and the surface of the discharge apparatus 13a faces the center axis M of the cylindrical member 12, through an intermediation of an insulation member 23a. The discharge apparatus 13a and the shower plate 24a are electrically insulated from each other by the insulation member 23a.

A gas pipe 25a is connected to the discharge apparatus 13a. A raw material gas supply apparatus 36a for accumulating a raw material gas and supplying the raw material gas is connected to the gas pipe 25a. When the raw material gas is discharged from the raw material gas supply apparatus 36a, the discharged raw material gas passes through the gas pipe 25a and is supplied to the hollow part of the discharge apparatus 13a. Then, the raw material gas is discharged to an outside of the discharge apparatus 13a through discharge holes formed in the shower plate 24a.

A conductive wire 26a is electrically connected to the shower plate 24a; and an AC power supply 35a is electrically connected to the conductive wire 26a through an intermediation of a matching unit (matching box) 27a.

The cylindrical member 12 and the film-forming chamber 11 are grounded.

When an AC voltage is applied from the AC power supply 35a to the shower plate 24a through the matching unit 27a and the conductive wire 25a, the raw material gas discharged through the discharge holes of the shower plate 24a is ionized to generate plasma. It is noted that the present invention encompasses a film-forming apparatus for forming a thin film without generating plasma.

The discharge unit 30a includes the cleaning chamber 20a. A shutter 22a is provided to the cleaning chamber 20a. When the shutter 22a is opened, an internal space of the cleaning chamber 20a is connected to the film-forming space 16 being an external space of the cleaning chamber 20a. When the shutter 22a is closed, the internal space of the cleaning chamber 20a is isolated from the film-forming space 16, and a cleaning gas is discharged into the internal space of the cleaning chamber 20a.

Further, the discharge unit 30a includes movement means 28a for moving the discharge apparatus 13a between a cleaning position being a position inside the cleaning chamber 20a and a film-forming position being a position closer to the cylindrical member 12 than the cleaning position, and for discharging the raw material gas by the discharge apparatus 13a. The film-forming position may be a position inside the cleaning chamber 20a or a position between the cleaning chamber 20a and the cylindrical, member 12. However, the film-forming position is a position facing a side surface that defines a curved surface of the cylindrical member 12.

FIG. 2 illustrates a state in which the discharge apparatus 13a is arranged at the film-forming position and the discharge apparatus 13b is arranged at the cleaning position.

In this embodiment, the cleaning chamber 20a is arranged opposite to the cylindrical member 12 across the discharge apparatus 13a (that is, arranged at a position facing a back surface of the discharge apparatus 13a).

The movement means 28a herein has a cylindrical shape, and is inserted into a through hole formed in a bottom surface of the cleaning chamber 20a under a state such that the movement means 28a is oriented perpendicular to the center axis M of the cylindrical member 12. One end of the movement means 28a, which is positioned inside the cleaning chamber 20a, is fixed to the discharge apparatus 13a; and a motor 21a is connected to another end of the movement means 28a, which is positioned outside the cleaning chamber 20a.

When power is transmitted from the motor 21a to the movement means 28a, the movement means 28a is moved in a movement direction perpendicular to the center axis M of the cylindrical member 12 together with the discharge apparatus 13a. Under the state in which the shutter 22a is opened, the discharge apparatus 13a is movable between the cleaning position inside the cleaning chamber 20a and the film-forming position closer to the cylindrical member 12 than the cleaning position. Thus, a distance between the film-forming position and the side surface of the cylindrical member 12 is shorter than a distance between the cleaning position and the side surface of the cylindrical member 12.

The discharge apparatus 13a can be brought closer to the cylindrical member 12 by the movement means 28a, so that the film formation can be carried out under a state in which an interval between the discharge apparatus 13a and the cylindrical member 12 is set to a predetermined value.

A gap between an outer circumferential surface of the movement means 28a and an inner circumferential surface of the through hole is closed by an expansible and contractible bellows 29a in an airtight manner. Even when the movement means 28a is moved together with the discharge apparatus 13a, the bellows 29a expands and contracts in the movement direction so as to maintain the airtightness of the cleaning chamber 20a.

In this embodiment, an interval between the film-forming position and the cleaning position is shorter than a length of the discharge apparatus 13a in the longitudinal direction. Thus, as compared to the film-forming apparatus $10_2$ according to the second embodiment described later (see, FIG. 3 referred to later), a movement distance of the discharge apparatus 13a is shorter; and hence, there is an advantage in that the bellows 29a is downsized.

In this embodiment, a cleaning gas supply apparatus 37a for accumulating a cleaning gas and supplying the cleaning gas is connected to the gas pipe 25a. When the cleaning gas is caused to flow out of the cleaning gas supply apparatus 37a, the cleaning gas thus flowing out passes through the gas pipe 25a and is supplied to the hollow part of the discharge apparatus 13a. Then, the cleaning gas is discharged through the discharge holes of the shower plate 24a.

Therefore, the structure is simpler than the structure for discharging the cleaning gas through cleaning gas discharge holes 45a and 45b formed in a wall surface of the cleaning chambers 20a and 20b (see, FIG. 3 referred to later). Thus, cost efficiency becomes higher.

Referring to FIG. 1, the film-forming apparatus $10_1$ according to the first embodiment of the present invention includes a control apparatus 18 for controlling the start and stop of the discharge of the raw material gas and the cleaning gas, and for controlling the movement of the discharge apparatus 13a to 13d. In FIG. 2, illustration of the control apparatus 18 is omitted.

The control apparatus 18 is configured to discharge the raw material gas from each of the discharge apparatus 13a to 13d when the discharge apparatus 13a to 13d are moved to the film-forming positions, and to close the shutters 22a to 22d and fill each of the cleaning chambers 20a to 20d with the cleaning gas when the discharge apparatus 13a to 13d are moved, to the cleaning positions.

A method of forming a thin film using the film-forming apparatus $10_1$ according to the first embodiment of the present invention is hereinafter described.

The control apparatus 18 is configured to carry out the following steps.

Preparation Step

Referring to FIG. 1, in this embodiment, a feed chamber 51 having a feed spindle 53 arranged therein and a take-up chamber 52 having a take-up spindle 54 arranged therein are connected to the film-forming chamber 11.

Center axes of the feed spindle 53 and the take-up spindle 54 are oriented parallel to the center axis M of the cylindrical member 12. The feed spindle 53 and the take-up spindle 54 are rotatable about the respective center axes.

In this embodiment, an object to be film-formed 60 has a film-like shape with a longitudinal direction, and is rolled into a roll shape with its one end in the longitudinal direction being positioned at a center. An original roll obtained by rolling the object to be film-formed 60 is carried into the feed chamber 51, and is mounted to the feed spindle 53. Reference numeral 57 represents an original roll in this state.

The feed spindle 53 is inserted through the original roll 57. In this state, when an end portion of the object to be film-formed 60 is pulled out from an outer circumference of the original roll 57, the original roll 57 is rotated in accordance with a pulling force. In this manner, the object to be film-formed 60 is pulled out from the original roll 57.

The end portion of the object to be film-formed 60 thus pulled out is looped around the cylindrical member 12; and a back surface of the object to be film-formed 60 is brought into close contact with an outer circumferential surface of the cylindrical member 12. Then, the end portion of the object to be film-formed 60 thus pulled out is rolled around and fixed to the take-up spindle 54. Reference numeral 58 represents a roller for changing a movement direction of the object to be film-formed 60.

In this embodiment, the take-up spindle 54 is a driving spindle, and the feed spindle 53 and the cylindrical member 12 are driven spindles. When the take-up spindle 54 is rotated, the feed spindle 53 is rotated, and the object to be film-formed 60 is fed from the original roll 57 having the object to be film-formed 60 rolled therearound.

At this time, the close contact state between the cylindrical member 12 and the back surface of the object to be film-formed 60 is maintained. When the cylindrical member 12 is rotated along with the movement of the object to be film-formed 60, the object to be film-formed 60 is moved in contact with the cylindrical member 12 without sliding relative to the cylindrical member 12. The object to be film-formed 60 is moved while facing each of the discharge apparatus 13a to 13d individually; that is, the object to be film-formed 60 is moved from the discharge apparatus on an upstream side toward the discharge apparatus on a downstream side.

It is noted that, as long as the object to be film-formed 60 is movable while the cylindrical member 12 is rotating, one or both of the cylindrical member 12 and the feed spindle 53 may be a driving spindle.

Vacuum evacuation units are connected to the film-forming chamber 11 and the cleaning chambers 20a to 20d, respectively. Reference numerals 19, 39a, and 39b of FIGS. 2 and 3 represent vacuum evacuation units. In FIG. 1, illustration of the vacuum evacuation units is omitted.

Referring to FIG. 2, in this embodiment, the vacuum evacuation units 39a and 39b that are different from each other are connected to the cleaning chambers 20a and 20b, respectively; however, the same vacuum evacuation unit may be connected to the cleaning chambers 20a and 20b.

The vacuum evacuation units are operated to vacuum evacuate the film-forming space 16 and the internal spaces of the cleaning chambers 20a to 20d, thereby forming a vacuum ambience. Consequently, the vacuum evacuation continues to maintain the vacuum ambience.

The cleaning chambers 20a to 20d are grounded in advance.

A switching position is defined in advance at least one position in the longitudinal direction, where the object to be film-formed 60 extends.

Furthermore, the film-forming position where each of the discharge apparatuses 13a to 13d discharges the raw material gas is determined in advance at such a position that an interval between a surface of each of the shower plates 24a to 24d and the outer circumferential surface of the cylindrical member 12 exhibits a desired value.

The discharge apparatus 13a to 13d are arranged in line from the upstream side in the movement direction of the object to be film-formed 60 toward the downstream side in the movement direction of the object to be film-formed 60. In this case, the discharge apparatus 13b positioned the second to the discharge apparatus positioned at the end of the upstream side is arranged at the cleaning position and the shutter 22b is closed in advance. The other discharge apparatus 13*a*, 13*c*, and 13*d* are arranged at the film-forming positions under a state in which the shutters 22*a*, 22*c*, and 22*d* are opened in advance.

The take-up spindle 54 is rotated so as to move the object to be film-formed 60. Thereafter, the rotation of the take-up spindle 54 is continued so as to continue the movement of the object to be film-formed 60.

Film-Forming Step

While the object to be film-formed 60 is being moved, the discharge apparatus 13*a*, 13*c*, and 13*d* arranged at the film-forming positions discharge the raw material gas through the discharge holes of the shower plates 24*a*, 24*c*, and 24*d*, and the AC voltages are applied to the shower plates 24*a*, 24*c*, and 24*d*, respectively. Examples of the raw material gas as used herein include $SiH_4$ gas, $NH_3$ gas, $N_2O$ gas, Ar gas, $H_2$ gas, and $N_2$ gas.

The discharged raw material gas is converted into plasma; and the plasma chemically reacts on the front surface of the object to be film-formed 60. As a result, a thin film is formed on a part of the front surface of the object to be film-formed 60, which faces each of the discharge apparatuses 13*a*, 13*c*, and 13*d* arranged at the film-forming positions to discharge the raw material gas. Examples of the thin film include $SiN_x$ film and $SiO_x$ film.

Every time the object to be film-formed 60 passes by a position facing each of the discharge apparatus 13*a*, 13*c*, and 13*d* arranged at the film-forming positions to discharge the raw material gas, thin films are sequentially deposited on the front surface of the object to be film-formed 60.

When the discharge apparatuses 13*a*, 13*c*, and 13*d* arranged at the film-forming positions continue to discharge the raw material gas, a part of the raw material gas adheres to the discharge apparatus 13*a*, 13*c*, and 13*d*, and an adhesion film is formed thereon. However, no adhesion film is formed on the discharge apparatus 13*b* arranged at the cleaning position to avoid discharging the raw material gas. The reason is because the film-forming space 16 and the internal space of the cleaning chamber 20*b* are isolated from each other by the shutter 22*b*, and because the raw material gas in the film-forming space 16 does not flow into the cleaning chamber 20*b*.

Switching Step

Relative positions of the switching position of the object to be film-formed 60 to the respective discharge apparatus 13*a* to 13*d* are determined based on a rotation angle of the cylindrical member 12. The relative positions may be determined based on a rotation speed and an elapsed time of the cylindrical member 12.

For example, a distance along the longitudinal direction of the object to be film-formed 60 between the switching position provided on the object to be film-formed 60 and each of the discharge apparatuses 13*a* to 13*d* is known prior to the start of the movement of the object to be film-formed 60, and a movement speed of the object to be film-formed 60 and a circumferential speed of the cylindrical member 12 are equal to each other. Accordingly, a time point at which the switching position faces each of the discharge apparatuses 13*a* to 13*d* can be calculated based on an angular speed of the cylindrical member 12. It is noted that a value of the rotation speed (angular speed) of the cylindrical member 12 is maintained when the cylindrical member 12 is accelerated up to a predetermined value.

A discharge apparatus to be subsequently moved to the cleaning position is determined in advance from among the discharge apparatuses 13*a*, 13*c*, and 13*d* arranged at the film-forming positions. In this case, the discharge apparatus 13*c* next to the discharge apparatus 13*b* which is arranged at the cleaning position, on the downstream side with respect to the movement direction of the object to be film-formed 60 is determined in advance as the discharge apparatus to be subsequently moved to the cleaning position. It is assumed that the same raw material gas is discharged from the discharge apparatus 13*a* to 13*d*.

Under a state in which the discharge apparatus 13*b* on the upstream side with respect to the movement direction of the object to be film-formed 60 is arranged at the cleaning position and the discharge apparatus 13*c* on the downstream side is arranged at the film-forming position, when the switching position of the object to be film-formed 60 passes by a position facing the discharge apparatus 13*b* on the upstream side, the shutter 22*b* is opened and the discharge apparatus 13*b* on the upstream side is moved to the film-forming position. Then, the discharge apparatus 13*b* starts to discharge the raw material gas through the discharge hole of the shower plate 24*b*, and the AC voltage is applied to the shower plate 24*b* so as to generate plasma. Thereafter, a thin film is formed on a part of the front surface of the object to be film-formed 60, which faces the discharge apparatus 13*b* on the upstream side.

Subsequently, when the switching position passes by a position facing the discharge apparatus 13*c* on the downstream side, the voltage application to the shower plate 24*c* is stopped so as to disappear the plasma, and the discharge of the raw material gas through the discharge hole of the shower plate 24*c* is stopped. Then, the discharge apparatus 13*c* on the downstream side is moved to the cleaning position, and the shutter 22*c* is closed. Thereafter, no thin film is formed on a part of the front surface of the object to be film-formed 60, which faces the discharge apparatus 13*c* on the downstream side.

Thus, the thin films formed by the discharge apparatuses 13*a*, 13*c*, and 13*d* are sequentially deposited on a part of the object to be film-formed 60, which is positioned on the downstream side of the switching position, and the thin films formed by the discharge apparatuses 13*a*, 13*b*, and 13*d* are sequentially deposited on a part of the object to be film-formed 60, which is positioned on the upstream side of the switching position.

The numbers of deposited thin films are equal to each other at the front and rear of the switching position, so that the entire film thickness becomes uniform; that is, a thin film having a uniform film thickness is continuously formed on the front surface of the object to be film-formed 60 over the longitudinal direction of the object to be film-formed 60.

Other Example of Switching Step

The following switching step may be carried out in place of the above-mentioned switching step.

First, the relative positions of the switching position of the object to be film-formed 60 to the respective discharge apparatuses 13*a* to 13*d* are determined by the same method as in the above-mentioned switching step.

The discharge apparatus to be subsequently moved to the cleaning position is determined in advance from among the discharge apparatuses 13*a*, 13*c*, and 13*d* arranged at the film-forming positions. In this case, the discharge apparatus 13*a* next to the discharge apparatus 13*b* which is arranged at the cleaning position, on the upstream side with respect to the movement direction of the object to be film-formed 60, is determined in advance as the discharge apparatus to be subsequently moved to the cleaning position.

Under a state in which the discharge apparatus 13a on the upstream side with respect to the movement direction of the object to be film-formed 60 is arranged at the film-forming position and the discharge apparatus 13b on the downstream side is arranged at the cleaning position, when the switching position of the object to be film-formed 60 passes by a position facing the discharge apparatus 13a on the upstream side, the voltage application to the shower plate 24a is stopped so as to make the plasma disappear, and the discharge of the raw material gas through the discharge hole of the shower plate 24a is stopped. Then, the discharge apparatus 13a on the upstream side is moved to the cleaning position, and the shutter 22a is closed. Thereafter, no thin film is formed on a part of the front surface of the object to be film-formed 60, which faces the discharge apparatus 13a on the upstream side.

Subsequently, when the switching position passes by a position facing the discharge apparatus 13b on the downstream side, the shutter 22b is opened and the discharge apparatus 13b on the downstream side is moved to the film-forming position. Then, the discharge apparatus 13b starts to discharge the raw material gas through the discharge hole of the shower plate 24b, and the AC voltage is applied to the shower plate 24b so as to generate plasma. Thereafter, a thin film is formed on a part of the front surface of the object to be film-formed 60, which faces the discharge apparatus 13b on the downstream side.

Thus, the thin films formed by the discharge apparatuses 13a, 13c, and 13d are sequentially deposited on a part of the object to be film-formed 60, which is positioned on the downstream side of the switching position, and the thin films formed by the discharge apparatus 13b, 13c, and 13d are sequentially deposited on a part of the object to be film-formed 60, which is positioned on the upstream side of the switching position.

The numbers of deposited thin films are equal to each other at the front and rear of the switching position, so that the entire film thickness becomes uniform; that is, a thin film having a uniform film thickness is continuously formed on the front surface of the object to be film-formed 60 over the longitudinal direction of the object to be film-formed 60.

Cleaning Step

Description is given by taking, as a representative example, a case where the discharge apparatus 13a is moved to the cleaning position.

After the discharge apparatus 13a is moved to the cleaning position, the shutter 22a is closed so as to isolate the internal space of the cleaning chamber 20a from the film-forming space 16.

The cleaning gas is discharged through the discharge hole of the shower plate 24a; and an inside of the cleaning chamber 20a is filled with the cleaning gas. The AC voltage is applied to the shower plate 24a so as to generate plasma of the cleaning gas. Examples of the cleaning gas as used herein include $NE_3$ gas, $N_2O$ gas, Ar gas, and $N_2$ gas.

When the plasma is brought into contact with the adhesion film adhering to the discharge apparatus 13a, the adhesion, film is decomposed and removed. The decomposed film is evacuated by the vacuum evacuation unit 39a.

The internal space of the cleaning chamber 20a and the film-forming space 16 are isolated from each other by the shutter 22a so that the cleaning gas does not flow into the film-forming space 16 to damage the object to be film-formed 60. Further, the raw material gas in the film-forming space 16 does not flow into the cleaning chamber 20a to cause film adhesion to the wall surface of the cleaning chamber 20a and to the discharge apparatus 13a.

After the adhesion film adhering to the discharge apparatus 13a is removed, the voltage application is stopped so as to disappear the plasma, and the discharge of the cleaning gas is stopped. Furthermore, the vacuum ambience is formed inside the cleaning chamber 20a.

While the discharge apparatus to be moved to the cleaning position is being switched in order among the discharge apparatuses 13a to 13d, the above-mentioned film-forming step, switching step, and cleaning step are repeated, to thereby continuously form a film on the front surface of the object to be film-formed 60.

The discharge apparatus 13a to 13d are moved in order into the cleaning chambers 20a to 20d, respectively, so that the adhesion film is removed. Thus, the adhesion film adhering to each of the discharge apparatuses 13a to 13d does not peel off and float in the film-forming space 16 to adulterate the thin film formed on the front surface of the object to be film-formed 60.

Structure of Film-Forming Apparatus According to Second Embodiment

Figure 3:
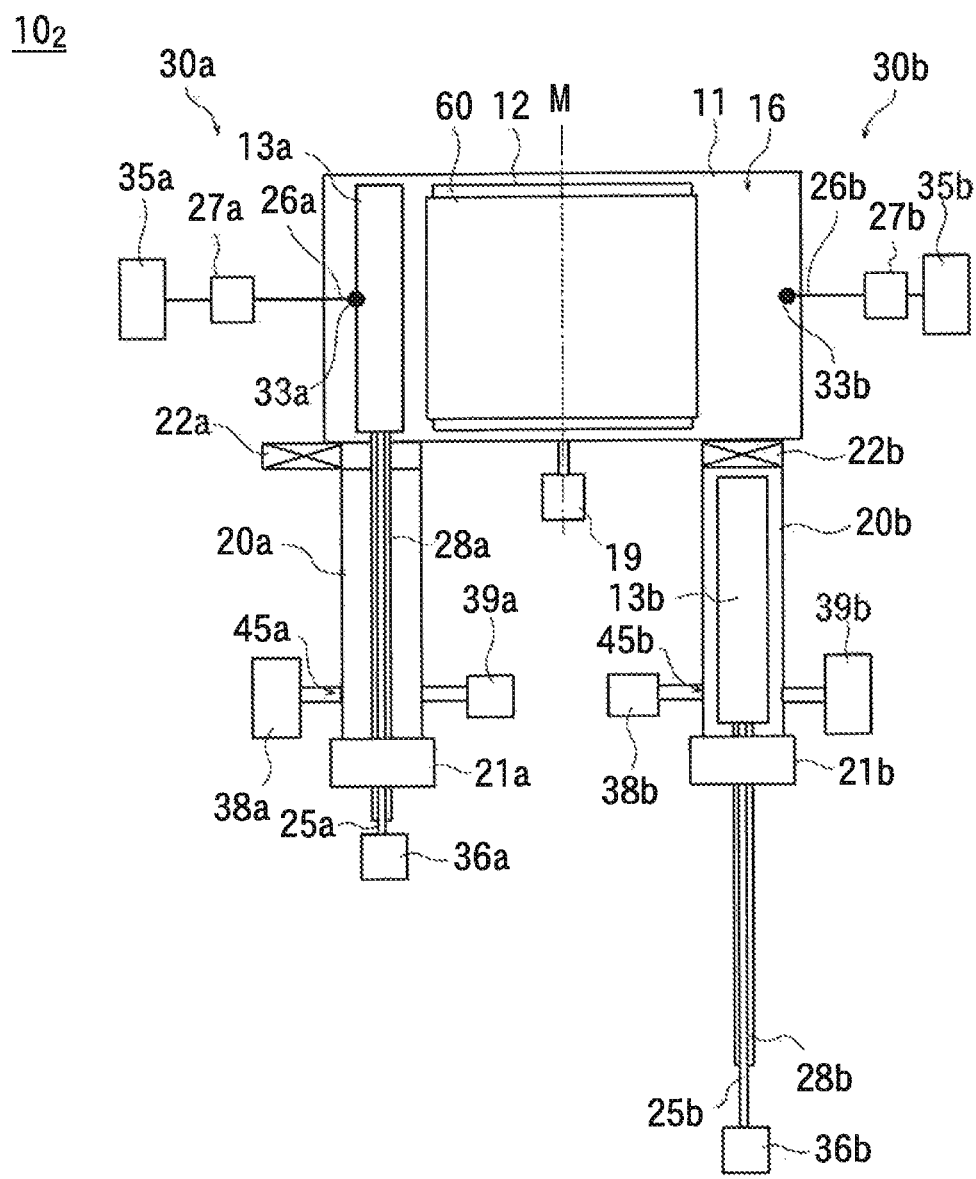
FIG. 3 is a sectional view cut along the line A-A shown in FIG. 1 of the film-forming apparatus according to a second embodiment of the present invention.

FIG. 3 illustrates the film-forming apparatus $10_2$ according to the second embodiment of the present invention. The film-forming apparatus $10_2$ includes the plurality of discharge units 30a to 30d. Components of the film-forming apparatus $10_2$ according to the second embodiment that are the same as the components of the film-forming apparatus $10_1$ according to the first embodiment are represented by the same reference numerals to omit description thereof. The positions of the cleaning chambers 20a to 20d of the film-forming apparatus $10_2$ according to the second embodiment are different from those of the film-forming apparatus $10_1$ according to the first embodiment; however, the film-forming position is the same as that of the film-forming apparatus $10_1$ according to the first embodiment. FIG. 3 corresponds to a sectional view cut along the line A-A of FIG. 1.

The discharge units 30a to 30d of the film-forming apparatus $10_2$ according to the second embodiment (FIG. 1 illustrates four discharge units, but FIG. 3 illustrates two cleaning chambers 20a and 20b instead) have the same structures as the discharge units 30a to 30d of the film-forming apparatus $10_1$ according to the first embodiment, respectively. However, the discharge units 30a to 30d of the film-forming apparatus $10_2$ according to the second embodiment are different from the discharge units 30a to 30d of the film-forming apparatus $10_1$ according to the first embodiment in that the cleaning chamber 20a is arranged at a position facing one end of the discharge apparatus 13a in the longitudinal direction, and that the movement means 28a is oriented parallel to the center axis M of the cylindrical member 12 and fixed to the discharge apparatus 13a.

When power is transmitted from the motor 21a to the movement means 28a, the movement means 28a is moved in a movement direction parallel to the center axis M of the cylindrical member 12 together with the discharge apparatus 13a. Under the state in which the shutter 22a is opened, the discharge apparatus 13a is movable between the cleaning position inside the cleaning chamber 20a and the Film-forming position closer to the cylindrical member 12 than the cleaning position. In the second embodiment, the film-forming position is a position outside the cleaning chamber 20*a*.

The shutter 22*a* of the film-forming apparatus 10$_2$ according to the second embodiment is smaller than the shutter 22*a* of the film-forming apparatus 10$_1$ according to the first embodiment. Thus, there is an advantage in that the film-forming space 16 and the internal space of the cleaning chamber 20*a* are easy to isolate from each other in the second embodiment.

In the film-forming apparatus 10$_2$ according to the second embodiment, a contact point 33*a* is provided to the conductive wire 26*a* (contact points 33*a* to 33*d* are provided to the conductive wires 26*a* to 26*d* of the four discharge units 30*a* to 30*d*, respectively). The contact point 33*a* is arranged in the film-forming space 16; and when the discharge apparatus 13*a* is arranged in the film-forming space 16, the contact point 33*a* is brought into contact with or separated away from the discharge apparatus 13*a*.

When the contact point 33*a* is brought into contact with the discharge apparatus 13*a*, the discharge apparatus 13*a* is connected to the AC power supply 35*a* through an intermediation of the contact point 33*a* and the conductive wire 26*a*; and hence, the discharge apparatus 13*a* is brought into a state in which the AC voltage is applied from the AC power supply 35*a* to the discharge apparatus 13*a*. In this case, the contact point 33*a* can be brought into contact with the shower plate of the discharge apparatus 13*a*. A distance between the AC power supply 35*a* and the contact point 33*a* can be shortened, so that power loss of the AC power supply 35*a* can be suppressed.

When the discharge apparatus 13*a* is arranged in the internal space of the cleaning chamber 20*a*, on the other hand, the contact point 33*a* is separated away from the discharge apparatus 13*a*; and hence, the discharge apparatus 13*a* is disconnected from the AC power supply 35*a* so that the AC voltage is not applied to the discharge apparatus 13*a*. FIG. 3 illustrates the discharge apparatus 13*a* positioned at the film-forming position and the discharge apparatus 13*b* positioned at the cleaning position.

Furthermore, unlike the film-forming apparatus 10$_1$ according to the first embodiment, a cleaning gas supply apparatus 38*a* of the film-forming apparatus 107 according to the second embodiment is not connected to the discharge apparatus 13*a*, but is connected to the cleaning gas discharge hole 45*a* formed in the wall surface of the cleaning chamber 20*a* (discharge holes 45*a* to 45*d* are formed in the four discharge units 30*a* to 30*d*, respectively). When the cleaning gas is supplied from the cleaning gas supply apparatus 38*a* to the cleaning gas discharge hole 45*a*, the cleaning gas is discharged into the cleaning chamber 20*a* through the cleaning gas discharge hole 45*a*.

A distance between the cleaning gas discharge hole 45*a* and the cleaning gas supply apparatus 38*a* can be shortened, so that a period of time required for the cleaning step can be shortened as compared to the structure in which the cleaning gas supply apparatus 37*a* is connected to the gas pipe 25*a* (see, FIG. 2).

A method of forming a thin film using the film-forming apparatus 10$_2$ according to the second embodiment is the same as the method of forming a thin film using the film-forming apparatus 10$_1$ according to the first embodiment, except for the cleaning step. Therefore, only the cleaning step is described below, and description of the other steps is omitted herein.

Cleaning Step

The cleaning steps to be carried out in the discharge units 30*a* to 30*d* are the same as each other, so that description is provided for the discharge unit 30*b* as a representative example.

After the discharge apparatus 13*b* is moved to the cleaning position, the shutter 22*b* is closed so as to isolate the internal space of the cleaning chamber 20*b* from the film-forming space 16.

The cleaning gas is discharged into the cleaning chamber 20*b* through the cleaning gas discharge hole 45*b*. Examples of the cleaning gas as used herein include $O_3$ gas or $NF_3$ plasma (ion). The plasma can be generated inside the cleaning chamber 20*b*.

When the cleaning gas is brought into contact with the adhesion film adhering to the discharge apparatus 13*b*, the adhesion film is decomposed and removed. The decomposed adhesion film is vacuum evacuated by the vacuum evacuation unit 39*a*.

The internal space of the cleaning chamber 20*b* and the film-forming space 16 are isolated from each other by the shutter 22*b*, so that the cleaning gas does not flow into the film-forming space 16 to damage the object to be film-formed 60. Furthermore, the raw material gas in the film-forming space 16 does not flow into the cleaning chamber 20*b* to cause film adhesion to the wall surface of the cleaning chamber 20*b* and to the discharge apparatus 13*b*.

After the adhesion film adhering to the discharge apparatus 13*b* is removed, the discharge of the cleaning gas through the cleaning gas discharge hole 45*b* is stopped. Furthermore, the vacuum ambience is formed inside the cleaning chamber 20*b*.

Structure of Film-Forming Apparatus According to Third Embodiment

Figure 4:
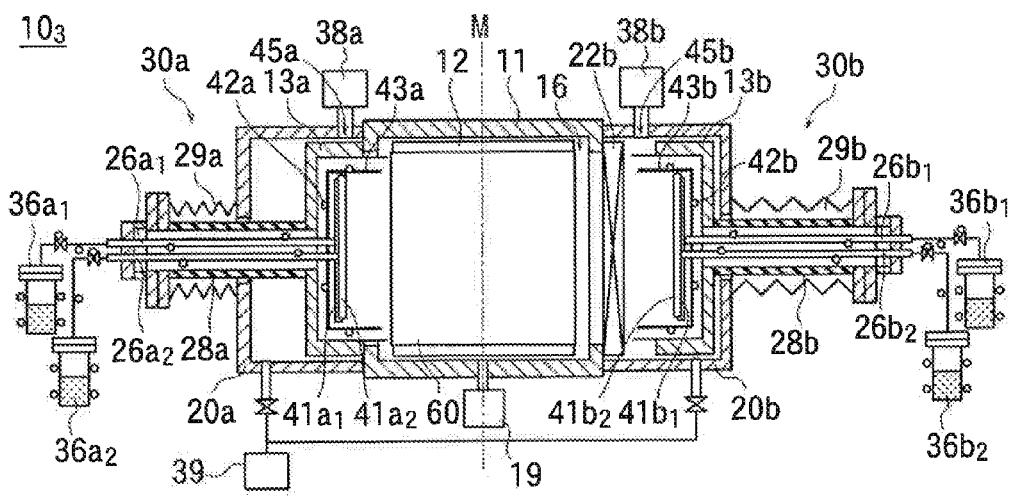
FIG. 4 is a sectional view cut along the line A-A shown in FIG. 1 of the film-forming apparatus according to a third embodiment of the present invention.

FIG. 4 is a sectional view cut along the line A-A of the film-forming apparatus 10$_3$ of FIG. 1 according to the third embodiment of the present invention.

Components of the film-forming apparatus 10$_3$ according to the third embodiment that are the same as the components of the film-forming apparatus 10$_1$ according to the first embodiment are represented by the same reference numerals to omit description thereof.

Description is given by taking the discharge unit 30*a* as a representative example among the discharge units 30*a* to 30*d* of the film-forming apparatus 10$_3$ according to the third embodiment. Unlike the film-forming apparatus 10$_1$ according to the first embodiment, the shower plate 24*a* is omitted from the discharge apparatus 13*a*, and in the hollow part of the discharge apparatus 13*a*, two elongate discharge pipes 41*a*$_1$ and 41*a*$_2$ are arranged so as to be oriented parallel to the center axis M of the cylindrical member 12.

In a surface of each of the discharge pipes 41*a*$_1$ and 41*a*$_2$, which faces the center axis M of the cylindrical member 12, a plurality of discharge holes (not shown) are formed in line along the longitudinal direction.

Gas pipes 26*a*$_1$ and 26*a*$_2$ that are different from each other are connected to the discharge pipes 41*a*$_1$ and 41*a*$_2$, respectively; and raw material gas supply apparatus 36*a*$_1$ and 36*a*$_2$ that are different from each other are connected to the gas pipes 26*a*$_1$ and 26*a*$_2$, respectively.

Solid or liquid film-forming materials are contained in the raw material gas supply apparatus 36*a*$_1$ and 36*a*$_2$, and the raw material gas supply apparatus 36*a*$_1$ and 36*a*$_2$ are configured to generate vapors by heating the contained film-forming materials, respectively.

When the vapors of the film-forming materials are generated by the raw material gas supply apparatus $36a_1$ and $36a_2$, the generated vapors pass through the gas pipes $26a_1$ and $26a_2$ and are supplied to the discharge pipes $41a_1$ and $41a_2$ that are different from each other, respectively. Then, the vapors are discharged through the discharge holes individually.

An adhesion preventive plate $43a$ is arranged on an outer side of the discharge pipes $41a_1$ and $41a_2$. Heaters $42a$ are fixed to the adhesion preventive plate $43a$ and the gas pipes $26a_1$ and $26a_2$. When the heaters $42a$ generate heat, the gas pipes $26a_1$ and $26a_2$ and the adhesion preventive plate $43a$ are heated so as to prevent condensation of the vapors on inner walls of the gas pipes $26a_1$ and $26a_2$ and the adhesion preventive plate $43a$.

Further, the film-forming apparatus $10_3$ according to the third embodiment is different from the film-forming apparatus $10_1$ according to the first embodiment but is the same as the film-forming apparatus $10_2$ according to the second embodiment in that the cleaning gas discharge hole $45a$ is formed in the cleaning chamber $20a$ and the cleaning gas is discharged into the cleaning chamber $20a$ through the cleaning gas discharge hole $45a$.

It is noted that, in this embodiment, the same vacuum evacuation unit 39 is connected to the cleaning chambers $20a$ and $20b$, but vacuum evacuation units that are different from each other may be connected to the cleaning chambers $20a$ and $20b$, respectively.

A method of forming a thin film using the film-forming apparatus $10_3$ according to the third embodiment of the present invention is described hereinafter.

Preparation Step

The same preparation step as in the method of forming a thin film using the film-forming apparatus $10_1$ according to the first embodiment is carried out.

Description is given by taking the discharge unit $30a$ as a representative example among the discharge units $30a$ to $30d$. A host organic material is contained in the one raw material gas supply apparatus $36a_1$ in advance, and a dopant organic material is contained in the other raw material gas supply apparatus $36a_2$ in advance.

In addition, a current is applied to flow through each of the heaters $42a$ to generate heat, thereby heating the gas pipes $26a_1$ and $26a_2$ and the adhesion preventive plate $43a$ in advance up to a temperature equal to or higher than a condensation temperature of the vapors of the organic materials.

Film-Forming Step

Description is given by taking the discharge apparatus $13a$ as a representative example among the discharge apparatus $13a$, $13c$, and $13d$ arranged at the film-forming positions. While the object to be film-formed 60 is being moved, the organic materials contained in the respective raw material gas supply apparatus $36a_1$ and $36a_2$ are individually heated to generate vapors. The vapor of the host organic material and the vapor of the dopant organic material are individually discharged through the discharge holes of the discharge pipes $41a_1$ and $41a_2$.

The discharged vapor of the host organic material and the discharged vapor of the dopant organic material reach the front surface of the object to be film-formed 60 together. As a result, an organic thin film is formed on a part of the front surface of the object to be film-formed 60, which faces each of the discharge apparatus $13a$, $13c$, and $13d$ arranged at the film-forming positions.

Every time the object to be film-formed 60 passes by the position facing each of the discharge apparatus $13a$, $13c$, and $13d$ arranged at the film-forming positions, organic thin films are sequentially deposited on the front surface of the object to be film-formed 60.

Switching Step

The same switching step as in the method of forming a thin film using the film-forming apparatus $10_1$ according to the first embodiment is carried out except that the steps of starting and stopping the voltage application to the shower plate are omitted. Therefore, description thereof is omitted herein.

Cleaning Step

The same cleaning step as in the method of forming a thin film using the film-forming apparatus $10_2$ according to the second embodiment is carried out. Therefore, description thereof is omitted herein.

Structure of Film-Forming Apparatus According to Fourth Embodiment

Figure 5:
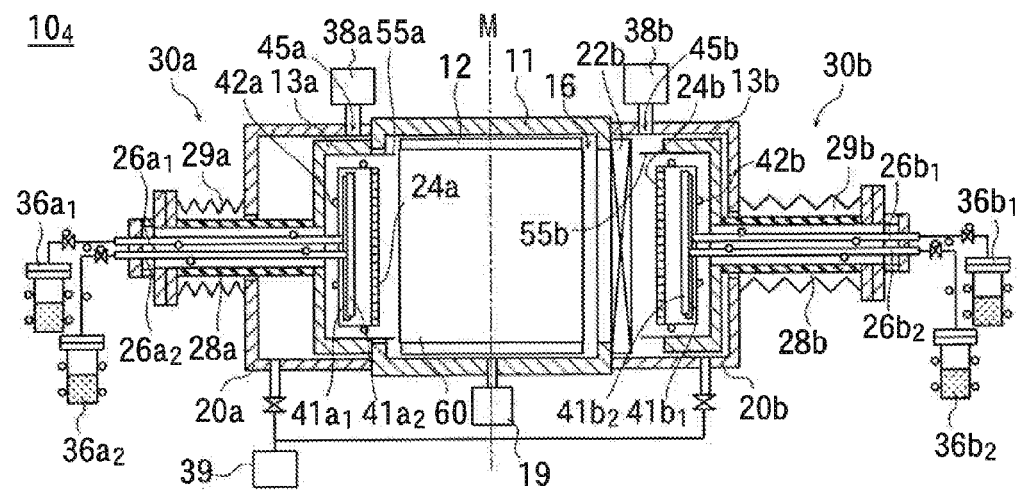
FIG. 5 is a sectional view cut along the line A-A shown in FIG. 1 of the film-forming apparatus according to a fourth embodiment of the present invention.
Figure 6:
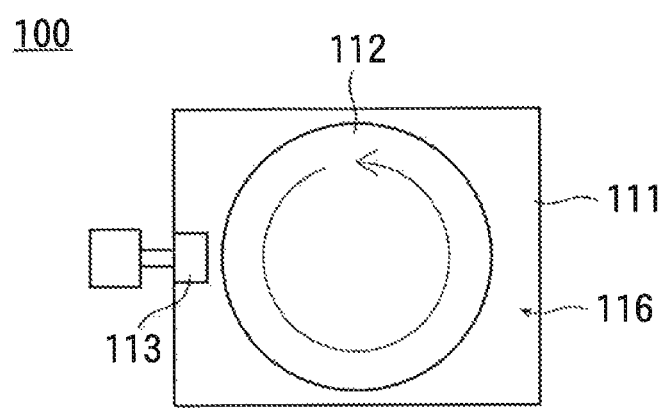
FIG. 6 is a structural view illustrating an inside of a conventional film-forming apparatus.

FIG. 5 is a sectional, view cut along the line A-A of the film-forming apparatus $10_4$ of FIG. 1 according to the fourth embodiment of the present invention.

Components of the film-forming apparatus $10_4$ according to the fourth embodiment that are the same as the components of the film-forming apparatus $10_3$ according to the third embodiment are represented by the same reference numerals to omit description thereof.

Description is given by taking the discharge unit $30a$ as a representative example among the discharge units $30a$ to $30d$ of the film-forming apparatus $10_4$ according to the fourth embodiment. Unlike the film-forming apparatus $10_3$ according to the third embodiment, the shower plate $24a$ is arranged in the hollow part of the discharge apparatus $13a$ so as to face the outer circumferential surface of the cylindrical member 12, and the discharge pipes $41a_1$ and $41a_2$ are arranged on an inner side of the shower plate $24a$.

The vapors of the film-forming materials, which are individually discharged through the discharge holes of the discharge pipes $41a_1$ and $41a_2$, are mixed with each other on the inner side of the shower plate $24a$, and then discharged through the discharge holes formed in the shower plate $24a$.

Further, unlike the film-forming apparatus $10_3$ according to the third embodiment, the adhesion preventive plate $43a$ is omitted from the film-forming apparatus $10_4$ according to the fourth embodiment, and the heaters $42a$ are fixed to the gas pipes $26a_1$ and $26a_2$ and the shower plate $24a$. When the heaters $42a$ generate heat, the gas pipes $26a_1$ and $26a_2$ and the shower plate $24a$ are heated so as to prevent condensation of the vapors on the inner walls of the gas pipes $26a_1$ and $26a_2$ and the shower plate $24a$.

A method of forming a thin film using the film-forming apparatus $10_4$ according to the fourth embodiment is the same as the method of forming a thin film using the film-forming apparatus $10_3$ according to the third embodiment, except for the preparation step and the film-forming step. Therefore, only the preparation step and the film-forming step are described below, and description of the other steps is omitted herein.

Preparation Step

The same preparation step as in the method of forming a thin film using the film-forming apparatus $10_1$ according to the first embodiment is carried out.

Description is given by taking the discharge unit $30a$ as a representative example among the discharge units $30a$ to $30d$. A first monomer (in this case, 4,4'-diphenylmethane diisocyanate (MDI)) is contained in the one raw material gas supply apparatus $36a_1$ in advance, and a second monomer (in this case, 4,4'-diaminodiphenylmethane (MDA)) to be subjected to vapor deposition polymerization with the first monomer is contained in the other raw material gas supply apparatus $36a_2$ in advance.

In addition, a current is caused to flow through each of the heaters $42a$ to generate heat, thereby heating the gas pipes $26a_1$ and $26a_2$ and the adhesion preventive plate $43a$ in advance up to a temperature equal to or higher than a condensation temperature of the first and second monomers.

Film-Forming Step

Description is given by taking the discharge apparatus $13a$ as a representative example among the discharge apparatus $13a$, $13c$, and $13d$ arranged at the film-forming positions. While the object to be film-formed 60 is being moved, the first and second monomers contained in the respective raw material gas supply apparatus $36a_1$ and $36a_2$ are individually heated to generate vapors. The vapors of the first and second monomers are individually discharged through the discharge holes of the discharge pipes $41a_1$ and $41a_2$. Further, the discharged vapors are mixed in the shower plate $24a$ and discharged from the shower plate $24a$.

The discharged vapors of the first and second monomers react with each other by vapor deposition polymerization on the front surface of the object to be film-formed 60. As a result, a vapor deposition polymerization film (in this case, a polyurea film) is formed on a part of the front surface of the object to be film-formed 60, which faces each of the discharge apparatus $13a$, $13c$, and $13d$ arranged at the film-forming positions.

Every time the object to be film-formed 60 passes by the position facing each of the discharge apparatus $13a$, $13c$, and $13d$ arranged at the film-forming positions, vapor deposition polymerization films are sequentially deposited on the front surface of the object to be film-formed 60.

It is noted that, in the embodiments described above, the number of the discharge units $30a$ to $30d$ is four; however, the number of the discharge units is riot limited to four in the film-forming apparatus according to the present invention. As long as a plurality of discharge units are provided, the number of the discharge units may be two, three, five, or more.

In the embodiments described above, each of the discharge apparatus $13a$ to $13d$ is moved between the cleaning position and the film-forming position. In the first and fourth embodiments described above, movable adhesion preventive plates are provided to the discharge apparatus $13a$ to $13d$. When the movable adhesion preventive plates are moved together with the discharge apparatus $13a$ to $13d$ and arranged at the cleaning positions, the shutters $22a$ to $22d$ of the cleaning chambers $20a$ to $20d$ may be closed so as to isolate the cleaning chambers $20a$ to $20d$ from the film-forming space 16 inside the film-forming chamber 11.

Reference numerals $55a$ and $55b$ illustrated in FIGS. 2 and 5 represent adhesion preventive plates arranged on the two discharge apparatus $13a$ and $13b$ on the upstream side, respectively. The shower plates $24a$ and $24b$ are surrounded by the adhesion preventive plates $55a$ and $55b$, respectively.

Furthermore, the members movable together with the shower plates $24a$ to $24d$ are not limited to the movable adhesion preventive plates $55a$ to $55d$. The present invention encompasses a case where other members are movable together with the discharge apparatus $13a$ to $13d$; and when the discharge apparatus $13a$ to $13d$ are arranged at the cleaning positions, the cleaning chambers $20a$ to $20d$ can be isolated from the film-forming space 16 inside the film-forming chamber 11.

As discussed above, the present invention provides a film-forming apparatus capable of cleaning a discharge apparatus under a state in which a film-forming space and a cleaning gas atmosphere are isolated from each other while continuing to form a film on an object to be film-formed having a film-like shape.

What is claimed is:

1. A film-forming apparatus, comprising:
a film-forming chamber having a film-forming space defined therein;
a cylindrical member arranged in the film-forming space and rotatable about one center axis; and
a plurality of discharge apparatuses arranged outside the cylindrical member along a circumferential direction of the cylindrical member, each of the plurality of discharge apparatuses being configured to discharge a raw material gas,
wherein an object to be film-formed having a film-like shape being into close contact with the cylindrical member so as to close contact a back surface of the object to be film-formed with the cylindrical member, the object to be film-formed is moved while rotating the cylindrical member, and a thin film is formed on a front surface of the object to be film-formed,
the film-forming apparatus, further comprising:
a cleaning chamber including a shutter, the cleaning chamber being configured to:
when the shutter is opened, connecting an internal space of the cleaning chamber to the film-forming space; and
when the shutter is closed, separating the internal space from the film-forming space, and
discharging a cleaning gas into the internal space;
means for moving each of the plurality of discharge apparatuses between a cleaning position inside the cleaning chamber and a film-forming position closer to the cylindrical member than the cleaning position; and
a control apparatus for controlling a start and stop of the discharge of the raw material gas and the discharge of the cleaning gas, and for controlling the movement of the each of the plurality of discharge apparatuses,
the control apparatus being configured to:
when each of the plurality of discharge apparatuses is moved to the film-forming position, controlling each of the plurality of discharge apparatuses to discharge the raw material gas; and
when each of the plurality of discharge apparatuses is moved to the cleaning position, controlling the shutter to be closed so as to fill the cleaning chamber with the cleaning gas.

2. The film-forming apparatus according to claim 1, wherein the cleaning gas is discharged from each of the plurality of discharge apparatus that is positioned inside the cleaning chamber.

3. The film-forming apparatus according to claim 1, wherein the cleaning gas is discharged through a cleaning gas discharge hole that is formed in a wall surface of the cleaning chamber.

4. The film-forming apparatus according to claim 1,
wherein under a state in which one of the plurality of discharge apparatuses on an upstream side with respect to a movement direction of the object to be film-formed is arranged at the film-forming position and another of the plurality of discharge apparatuses on a downstream side with respect to the movement direction of the object to be film-formed is arranged at the cleaning position, the control apparatus is configured to:
control one of the plurality of discharge apparatuses on the upstream side to move to the cleaning position when a switching position provided to the object to be film-formed passes by a position facing the one of the plurality of discharge apparatuses on the upstream side; and
control the another of the plurality of discharge apparatuses on the downstream side to move to the film-forming position when the switching position passes by a position facing the another of the plurality of discharge apparatuses on the downstream side.

5. The film-forming apparatus according to claim 1,
wherein under a state in which one of the plurality of discharge apparatuses on the upstream side with respect to the movement direction of the object to be film-formed is arranged at the cleaning position and another of the plurality of discharge apparatuses on the downstream side with respect to the movement direction of the object to be film-formed is arranged at the film-forming position, the control apparatus is configured to:
control the one of the plurality of discharge apparatuses on the upstream side to move to the film-forming position when the switching position provided to the object to be film-formed passes by the position facing the one of the plurality of discharge apparatuses on the upstream side; and
control the another of the plurality of discharge apparatuses on the downstream side to move to the cleaning position when the switching position passes by the position facing the another of the plurality of discharge apparatuses on the downstream side.

6. The film-forming apparatus according of claim 1,
wherein each of the plurality of discharge apparatuses further comprises a movable adhesion preventive plate, and
wherein when each of the plurality of discharge apparatuses is positioned at the cleaning position, the movable adhesion preventive plate is positioned inside the cleaning chamber that is separated from the film-forming space.

* * * * *